United States Patent [19]
Koshak

[11] Patent Number: 5,785,518
[45] Date of Patent: Jul. 28, 1998

[54] MASKING ELEMENT FIXTURE

[75] Inventor: Daniel R. Koshak, South Nyack, N.Y.

[73] Assignees: Sony Corporation, Tokyo, Japan;
Materials Research Corporation,
Orangeburg, N.Y.

[21] Appl. No.: 316,269

[22] Filed: Sep. 30, 1994

[51] Int. Cl.$^6$ ..................................................... F27D 5/00
[52] U.S. Cl. ...................... 432/253; 432/5; 432/241
[58] Field of Search .................... 432/5, 121, 241, 432/253, 258, 261

[56] References Cited

U.S. PATENT DOCUMENTS

| | | | |
|---|---|---|---|
| 3,951,587 | 4/1976 | Alliegro et al. | 432/253 |
| 4,228,902 | 10/1980 | Schulle | 211/41 |

*Primary Examiner*—Henry A. Bennett
*Assistant Examiner*—Siddharth Ohri
*Attorney, Agent, or Firm*—Pasquale Musacchio; Jerry A. Miller

[57] ABSTRACT

A fixture for holding a plurality of masking elements while the masking elements are being baked to remove impurities is disclosed. The masking elements are used to mask dies used for forming sputtering targets used to deposit thin films on a substrate. The fixture includes a housing having first and second end walls connected between first and second side walls wherein the first and second end and side walls form an interior aperture. In addition, the fixture includes a several slots which are formed in the first and second side walls wherein each of the slots are suitable for holding a single masking element. In particular, the interior aperture is of a sufficient size and the slots are positioned such that suitable air circulation is provided between each of the masking elements to expose the masking elements to a predetermined temperature suitable for removing the impurities from the masking elements. Furthermore, the fixture includes openings formed in the end walls which enable handling of the fixture and provide additional air circulation.

13 Claims, 1 Drawing Sheet

MASKING ELEMENT FIXTURE

FIELD OF THE INVENTION

The present invention relates to the manufacture of sputtering targets used for sputtering of thin films onto a substrate and more particularly, to a fixture used to substantially reduce contamination of a masking element used in the manufacture of the sputtering targets.

BACKGROUND OF THE INVENTION

An integrated circuit (IC) is manufactured by a process which utilizes planar technology. This process includes subjecting a substrate, such as a silicon or a gallium arsenide wafer, to a sputtering process in which a sputtering target is utilized to deposit a thin layer or film of metal on the substrate. In order to ensure that a high purity layer is deposited on the substrate, it is essential that the sputtering target be substantially free of contamination. Typically, the sputtering target is manufactured by a powder metallurgy process in which powders of desired materials are mixed and then compressed in a die to a desired shape. Next, the powders are exposed to a high temperature to promote bonding of the powders to form a bonded mass or solid in the desired shape. The die is typically lined with thin strips of a masking material formed from carbon paper known as GRAFOIL™ paper manufactured by Union Carbide Corporation prior to being used in the process. The GRAFOIL™ paper serves to mask areas of the die so that only predetermined areas are exposed to the powders in order to form the desired shape.

It is desirable that layers of higher purity than previously required are deposited on the substrate in order to provide IC's having improved performance and quality. However, it has been determined that impurities such as sodium, calcium and phosphorous are introduced by the GRAFOIL™ paper during the manufacturing process. In order to remove a sufficient amount of such impurities, the GRAFOIL™ paper is subjected to a temperature of approximately 1750° C. for 24 hours prior to being used in a die in order to bake out the impurities.

Generally, the GRAFOIL™ paper is supplied in relatively large rolls which are then divided into sections having desired shapes. Typically, a large quantity of GRAFOIL™ sections of various sizes and shapes are needed on a daily basis for manufacturing purposes. Since the GRAFOIL™ sections are baked for 24 hours, it is desirable that a large quantity of GRAFOIL™ sections are baked simultaneously in order to reduce manufacturing time and associated cost. In order to achieve this, several GRAFOIL™ sections are either vertically stacked or leaned upright in an oven such that they are in contact with each other. However, this has been found to be ineffective in exposing inner areas of each of the GRAFOIL™ sections which are in contact with each other to circulating air used to subject the GRAFOIL™ sections to the desired temperature. Further, baking an entire roll of GRAFOIL™ paper before it is divided has also been found to be ineffective since inner layers of the roll are also not exposed to the circulating air. Therefore, there is a need in the art for a fixture which enables relatively large quantities of GRAFOIL™ sections to be baked simultaneously such that a sufficient area of each GRAFOIL™ section is exposed to the desired temperature for baking out impurities.

SUMMARY OF THE INVENTION

A fixture for holding a plurality of masking elements while baking the masking elements to remove impurities. The fixture includes a housing having first and second end walls connected between first and second side walls wherein the first and second end and side walls form an interior aperture. In addition, the fixture includes a several slots which are formed in the first and second side walls wherein each of the slots are suitable for holding a single masking element. In particular, the interior aperture is of a sufficient size and the slots are positioned such that suitable air circulation is provided between each of the masking elements to subject the masking elements to a predetermined temperature suitable for removing the impurities from the masking elements. Furthermore, the fixture includes openings formed in the end walls which enable handling of the fixture and provide additional air circulation.

Fixture 3 in an end view of the masking element fixture.

DETAILED DESCRIPTION OF THE INVENTION

It has been determined that impurities such as sodium, calcium and phosphorous are introduced by GRAFOIL™ used to line dies during the manufacturing of sputtering targets. In order to remove a sufficient amount of such impurities, the GRAFOIL™ is subjected to a temperature of approximately 1750° C. for 24 hours prior to being used in a die. Typically, a large quantity of GRAFOIL™ sections of various sizes and shapes are needed on a daily basis for manufacturing purposes. Since the GRAFOIL™ sections are baked for 24 hours, it is desirable that a large quantity of GRAFOIL™ sections are baked at the same time in order to reduce manufacturing time. The present invention provides for a fixture which enables relatively large quantities of GRAFOIL™ sections to be baked simultaneously such that a sufficient area of each GRAFOIL™ section is subjected to the desired temperature for baking out impurities.

Figure 1:
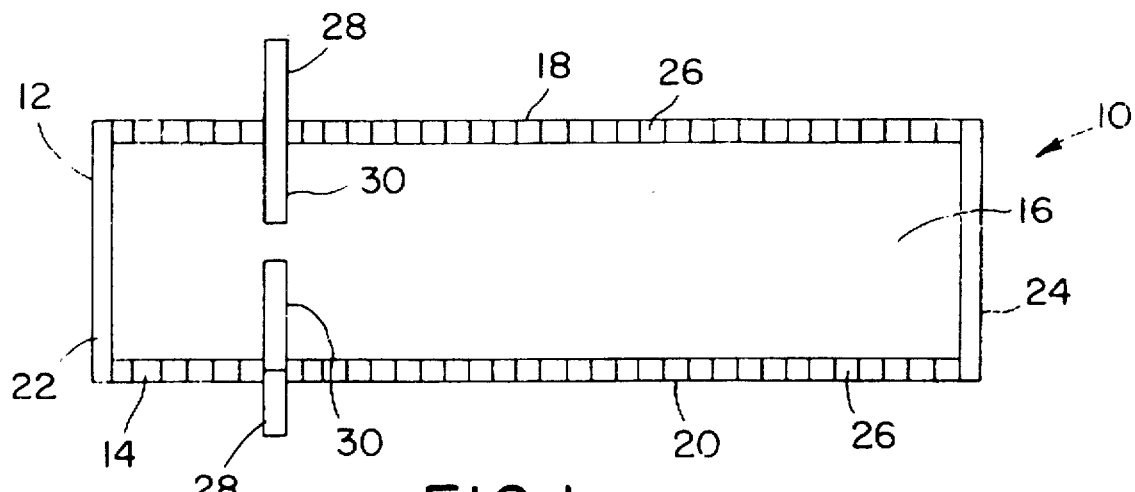
FIG. 1 is top view of a masking element fixture in accordance with the present invention.
Figure 2:
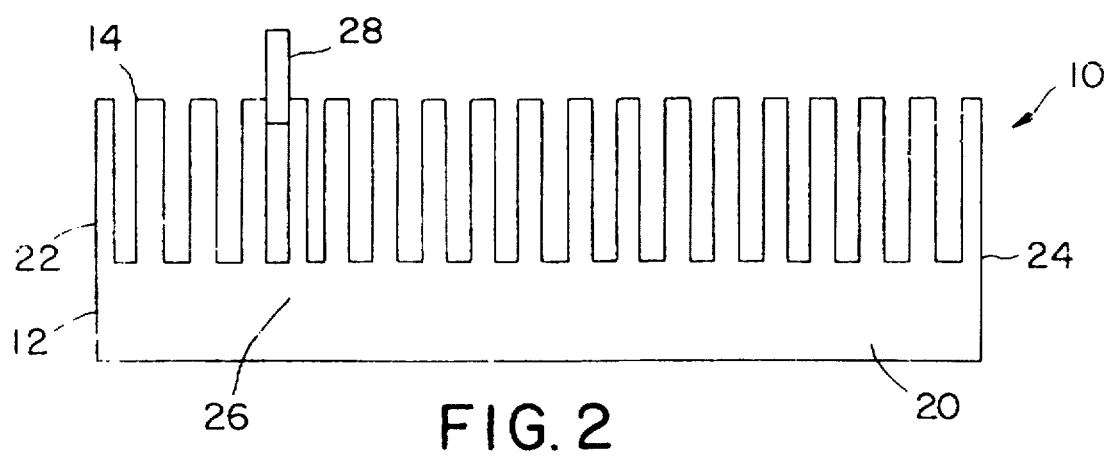
FIG. 2 is a side view of the masking element fixture.

The present invention will now be described by referring to FIGS. 1–3, wherein like elements are designated by like reference numerals. Referring to FIGS. 1 and 2, top and side views of a masking element fixture 10 in accordance with the present invention are shown. The fixture 10 includes a substantially rectangular housing 12 having a top surface 14 and an interior aperture 16 to form first 18 and second 20 side walls which are spaced apart by first 22 and second 24 end walls. The first 18 and second 20 side walls each include a plurality of slots 26 which extend downwardly from the top surface 14. Each of the slots 26 are sized to hold a single associated GRAFOIL™ section (only two GRAFOIL™ sections 28 are shown for purposes of clarity). By way of example, the first 18 and second 20 side walls may each include up to 30 slots each of which may be 0.030 to 0.050 inches wide. Further, each of the GRAFOIL™ sections 28 include interior areas 30 which are positioned within the interior aperture 16 when the GRAFOIL™ sections 28 are positioned in their associated slots 26.

In addition, the first 18 and second 20 side walls are spaced apart from each other such that GRAFOIL™ sections 28 of various sizes may be held in slots 26 located in both the first 18 or second 20 side walls such that the GRAFOIL™ sections 28 do not contact or interfere with each other. In this manner, a large quantity of GRAFOIL™ sections 28 may be simultaneously baked in order to remove impurities in the GRAFOIL™ sections 28. Furthermore, the slots 26 in the first 18 and second 20 side walls may also be staggered relative to one another to eliminate contact between opposed GRAFOIL™ sections 28. In addition, the fixture 10 is fabricated from a material suitable for withstanding a desired temperature used for baking the GRAFOIL™ sections 28 such as graphite.

Further, it is desirable that a sufficient area of each of the GRAFOIL™ sections 28 be exposed to circulating air suitable for subjecting the GRAFOIL™ sections 28 to the desired temperature. Therefore, the interior aperture 16 is of sufficient size to enable sufficient air circulation between the interior areas 30 in order to subject the interior areas 30 to the desired temperature. It has been found that a separation of approximately 7 inches between the first 18 and second 20 side walls and of approximately 23 inches between the first 22 and second 24 end walls forms an interior aperture 16 of sufficient size to enable suitable air circulation between the interior areas 30.

In addition, the first 18 and second 20 side walls are both relatively thin in cross section so as to minimize the area of each of the GRAFOIL™ sections 28 within the slots 26 which is not directly exposed to circulating air. By way of example, the first 18 and second 20 walls may each be 0.5 inches thick. In this manner, a sufficient area of each of the GRAFOIL™ sections 28 is exposed to the circulating air such that a sufficient amount of impurities are removed from each of the GRAFOIL™ sections 28 to enable use in a die utilized for sputter target manufacturing.

Figure 3:
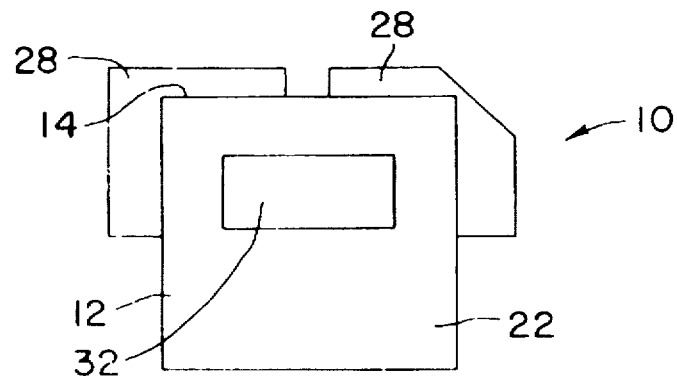

Referring to FIG. 3, an end view of the first end wall 22 is shown. The fixture 10 further includes openings 32 formed in the first end wall 22 and the second side wall 24 (not shown) which enable a user to handle and manipulate the fixture 10 during the manufacturing process. In addition, the openings 32 serve to promote further air circulation within the interior aperture 16 during baking of the GRAFOIL™ sections 28.

Thus it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A fixture for holding a plurality of masking elements used in the manufacture of sputtering targets, wherein each of said masking elements are baked to remove impurities and each of said masking elements include a peripheral edge, comprising:

a housing having first and second end walls connected between first and second side walls, said first and second end and side walls forming an interior aperture for providing air circulation within said aperture for subjecting each of said masking elements to a predetermined temperature for removing said impurities, wherein said first and second side walls include first and second top surfaces, respectively;

a plurality of slots formed in said first and second side walls, each of said slots extending vertically through said first and second top surfaces and extending partially into said first and second side walls, respectively, wherein each of said slots is adapted to independently hold a portion of a peripheral edge of a single masking element such that each of said masking elements extends through a respective top surface thereby maximizing an amount of surface area of each of said masking elements which is exposed to suitable air circulation between each of said masking elements for subjecting said masking elements to said predetermined temperature; and openings formed in said end walls to enable handling of said fixture and for providing said air circulation within said aperture.

2. The fixture according to claim 1, wherein said slots are approximately 0.030 to 0.050 inches wide.

3. The fixture according to claim 1, wherein said interior aperture is approximately 23 inches long and 7 inches wide.

4. The fixture according to claim 1, wherein said fixture includes 60 slots.

5. The fixture according to claim 1, wherein said side wall is approximately 0.5 inches thick.

6. The fixture according to claim 1, wherein said housing is fabricated from graphite.

7. The fixture according to claim 1, wherein said masking elements are fabricated from carbon paper.

8. A fixture for holding a plurality of masking elements used in the manufacture of sputtering targets, wherein each of said masking elements are baked to remove impurities and each of said masking elements include a peripheral edge, comprising:

a housing having first and second end walls connected between first and second side walls, said first and second end and side walls forming an interior aperture for providing air circulation within said aperture for subjecting each of said masking elements to a predetermined temperature for removing said impurities, wherein said first and second side walls include first and second top surfaces, respectively and, wherein said first and second end and side walls are fabricated from graphite;

a plurality of slots formed in said first and second side walls, each of said slots extending vertically through said first and second top surfaces and extending partially into said first and second side walls, respectively, wherein each of said slots is adapted to independently hold a portion of a peripheral edge of a single masking element such that each of said masking elements extends through a respective top surface thereby enabling a substantial portion of each of said masking elements to be exposed to suitable air circulation between each of said masking elements for subjecting said masking elements to said predetermined temperature; and openings formed in said end walls to enable handling of said fixture and for providing said air circulation within said aperture.

9. The fixture according to claim 8, wherein said slots are approximately 0.030 to 0.050 inches wide.

10. The fixture according to claim 9, wherein said interior aperture is approximately 23 inches long and 7 inches wide.

11. The fixture according to claim 10, wherein said fixture includes 60 slots.

12. The fixture according to claim 11, wherein said side wall is approximately 0.5 inches thick.

13. The fixture according to claim 12, wherein said masking elements are fabricated from carbon paper.

* * * * *